(12) United States Patent
Li et al.

(10) Patent No.: US 11,470,723 B2
(45) Date of Patent: Oct. 11, 2022

(54) LENS MODULE AND ELECTRONIC DEVICE HAVING THE SAME

(71) Applicant: TRIPLE WIN TECHNOLOGY(SHENZHEN) CO.LTD., Shenzhen (CN)

(72) Inventors: Jing-Wei Li, Guangdong (CN); Shin-Wen Chen, New Taipei (TW); Ding-Nan Huang, New Taipei (TW); Sheng-Jie Ding, Guangdong (CN); Jian-Chao Song, Guangdong (CN)

(73) Assignee: TRIPLE WIN TECHNOLOGY (SHENZHEN) CO. LTD., Shenzhen (CN)

( * ) Notice: Subject to any disclaimer, the term of this patent is extended or adjusted under 35 U.S.C. 154(b) by 159 days.

(21) Appl. No.: 16/860,459

(22) Filed: Apr. 28, 2020

(65) Prior Publication Data
US 2021/0168939 A1 Jun. 3, 2021

(30) Foreign Application Priority Data
Dec. 2, 2019 (CN) .......................... 201911214893.9

(51) Int. Cl.
*H04N 5/225* (2006.01)
*H05K 1/18* (2006.01)
*G02B 7/02* (2021.01)
*G03B 11/00* (2021.01)

(52) U.S. Cl.
CPC ............... *H05K 1/181* (2013.01); *G02B 7/02* (2013.01); *G03B 11/00* (2013.01); *H04N 5/2253* (2013.01); *H05K 2201/10121* (2013.01); *H05K 2201/10151* (2013.01)

(58) Field of Classification Search
CPC ..................................................... H04N 5/2253
USPC ............................................................ 348/374
See application file for complete search history.

(56) References Cited

U.S. PATENT DOCUMENTS

2014/0293558 A1* 10/2014 Lim ..................... H05K 9/0039
29/829

FOREIGN PATENT DOCUMENTS

| CN | 108769491 A | 11/2018 |
| CN | 110519487 A | 11/2019 |

* cited by examiner

*Primary Examiner* — Joel W Fosselman
(74) *Attorney, Agent, or Firm* — ScienBiziP, P.C.

(57) ABSTRACT

A lens module includes a circuit board, a base mounted on the circuit board, and at least one electronic component mounted on the circuit board. The base comprises a first surface and a second surface facing away from the first surface. The second surface is mounted on the circuit board. The base further comprises at least one first hole passing through the first surface and the second surface. The at least one electronic component is received in the at least one first hole. The lens module further comprises a filling layer in each of the at least one first hole and located on a side of the at least one electronic component facing away from the circuit board. The disclosure also provides an electronic device having the lens module.

16 Claims, 5 Drawing Sheets

LENS MODULE AND ELECTRONIC DEVICE HAVING THE SAME

FIELD

The subject matter herein generally relates to a lens module and an electronic device having the lens module.

BACKGROUND

With the miniaturization of electronic products, the lens module is an important component in electronic products, and its size design will have a greater impact on the overall size of the electronic products. However, in order to prevent electronic components on the circuit board of the lens module from affecting camera function, a safety distance is generally reserved between the electronic components and the base of the lens module, and a thickness of the base is also increased, thereby affecting a height of the lens module.

Therefore, there is room for improvement within the art.

BRIEF DESCRIPTION OF THE DRAWINGS

Implementations of the present disclosure will now be described, by way of embodiments, with reference to the attached figures.

DETAILED DESCRIPTION

Figure 1:
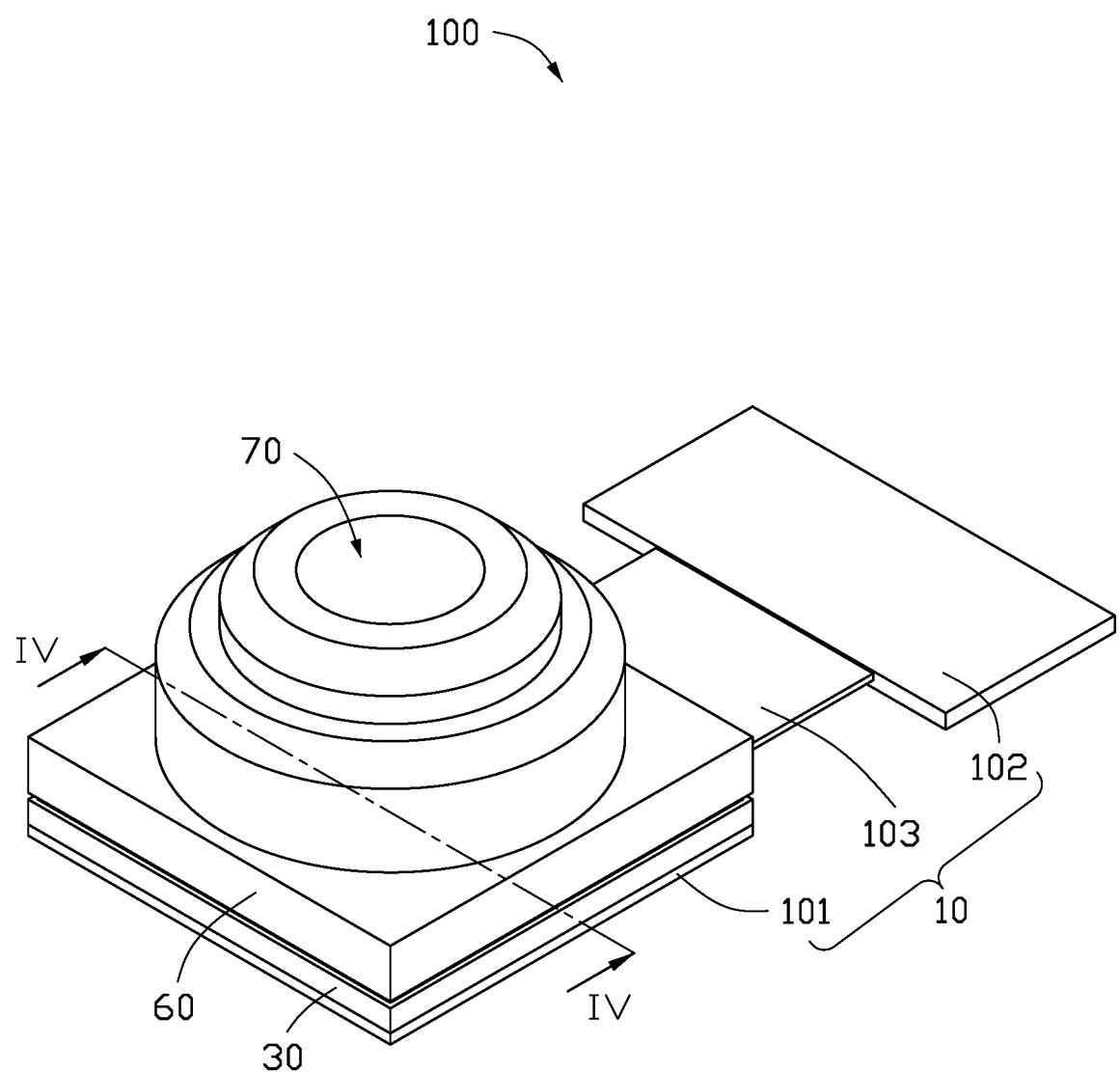
FIG. 1 is a diagram of an embodiment of a lens module.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

Figure 2:
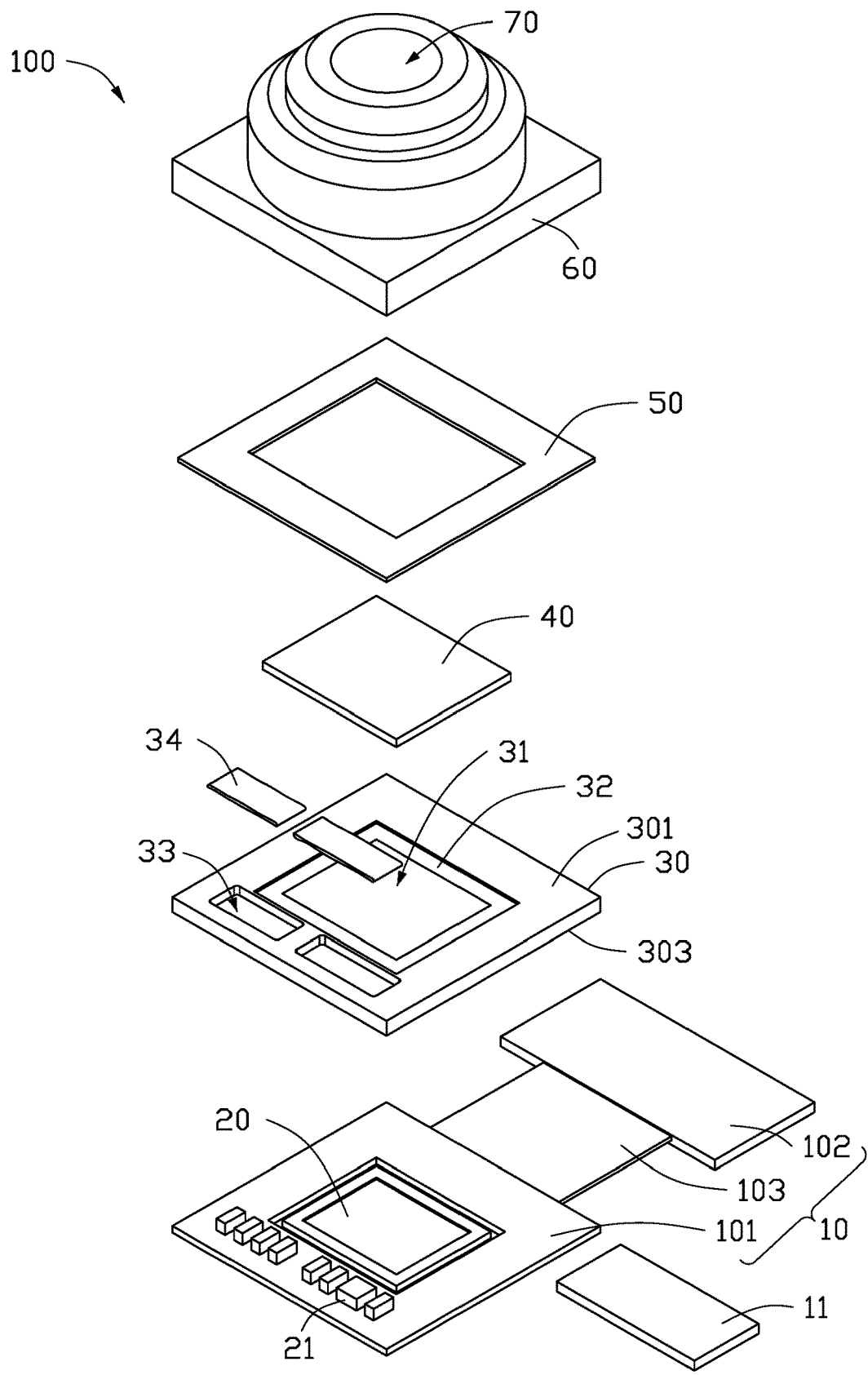
FIG. 2 is an exploded, diagrammatic view of the lens module of FIG. 1.

FIG. 1 illustrates an embodiment of a lens module 100. Referring to FIG. 2, the lens module 100 includes a circuit board 10, a base 30, a filter 40, a lens holder 60, and a lens 70.

In at least one embodiment, the circuit board 10 may be a flexible circuit board, a rigid circuit board, or a rigid-flexible circuit board. In an embodiment, the circuit board 10 is a rigid-flexible circuit board including a first rigid portion 101, a second rigid portion 102, and a flexible portion 103 connecting the first rigid portion 101 and the second rigid portion 102. At least one electronic connecting element 11 is mounted on a surface of the second rigid portion 102. When the lens module 100 is applied to an electronic device 200 (shown in FIG. 5), the electronic connecting element 11 is configured to transmit signals between the lens module 100 and other components of the electronic device 200. In at least one embodiment, the electronic connecting element 11 may be a connector or a gold finger.

Figure 3:
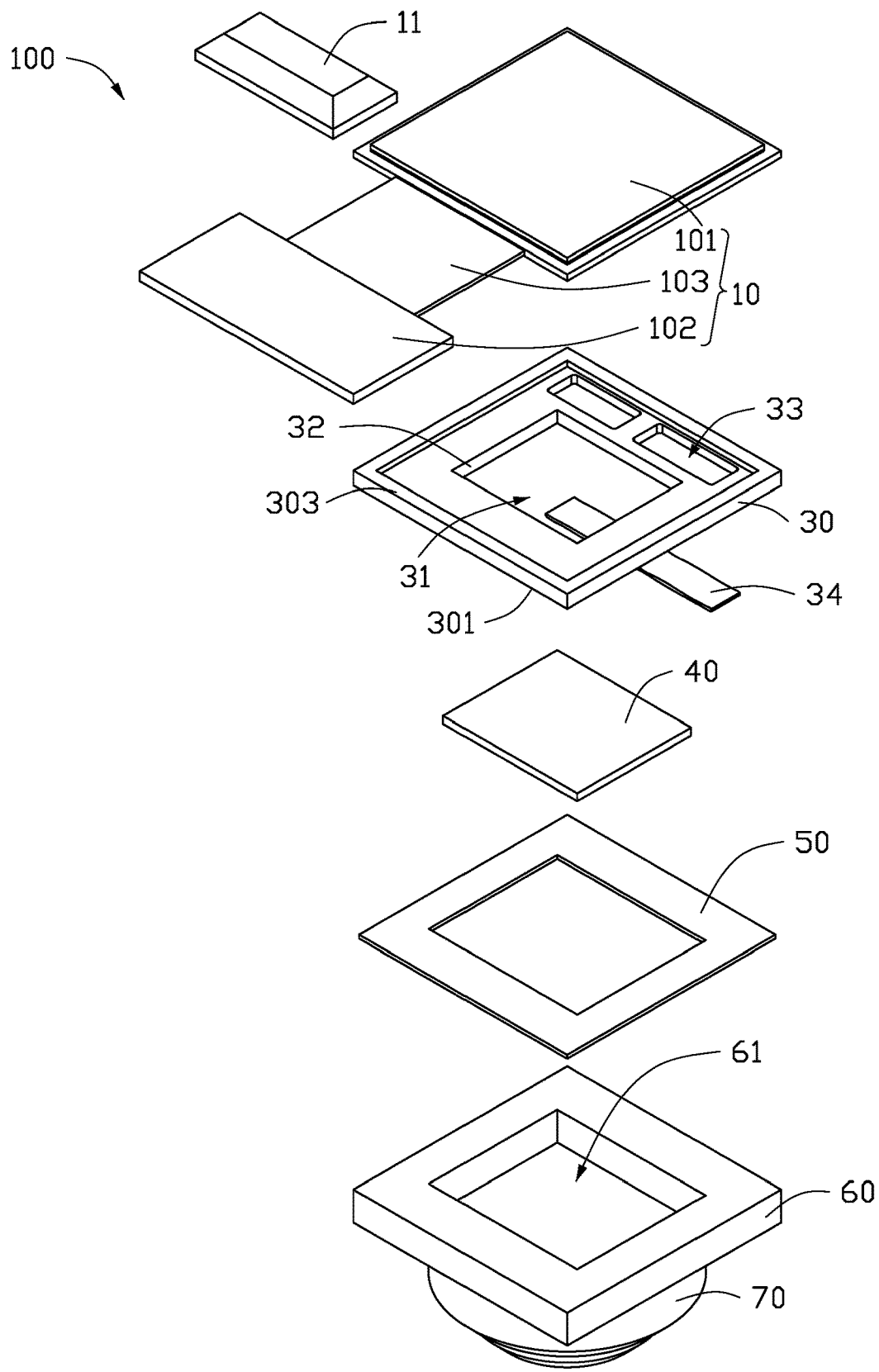
FIG. 3 is an exploded, diagrammatic view of the lens module of FIG. 1 viewed from another angle.

A photosensitive chip 20 and a plurality of electronic components 21 are mounted on the first rigid portion 101. In at least one embodiment, the photosensitive chip 20 and the plurality of electronic components 21 may be mounted on a same surface of the first rigid portion 101. Referring to FIGS. 2 and 3, the photosensitive chip 20 and the at least one electronic connecting element 11 may be mounted on two opposite surfaces of the circuit board 10. The electronic components 21 may be at least one of resistors, capacitors, diodes, triodes, relays, and electrically erasable programmable read-only memory (EEPROM).

Figure 4:
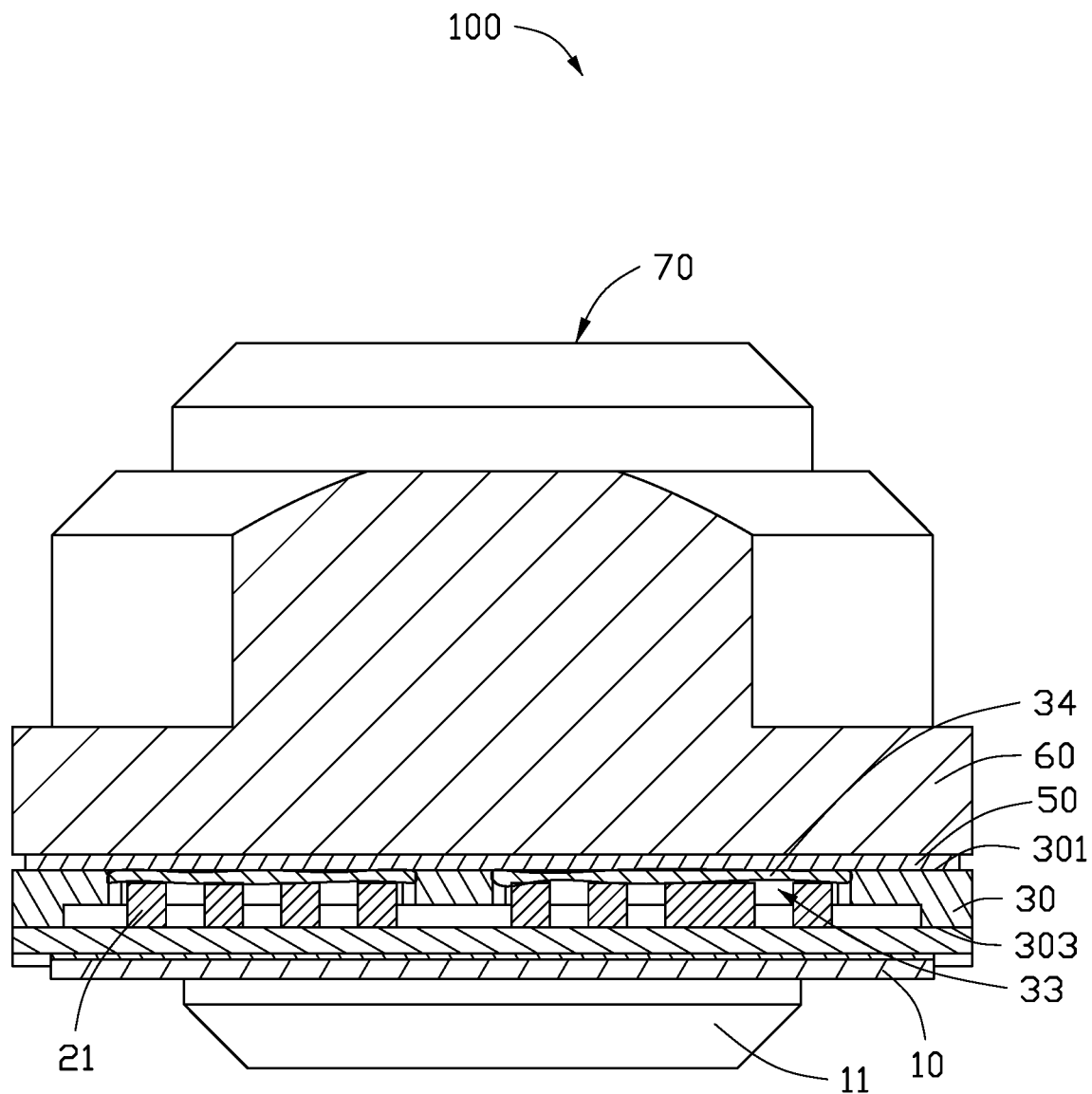
FIG. 4 is a cross-sectional view of the lens module taken along IV-IV line of FIG. 1.

Referring to FIG. 4, the base 30 includes a first surface 301 and a second surface 303 facing away from the first surface 301. In at least one embodiment, the base 30 may be rectangular. The base 30 includes an opening 31 passing through the first surface 301 and the second surface 303. In at least one embodiment, the opening 31 is rectangular. An annular protruding portion 32 extends from an inner surface of the opening 31 toward a center of the opening 31.

In another embodiment, the opening 31 may be any other shape, such as circular or prismatic.

The second surface 303 is fixed to a surface of the first rigid portion 101 where the photosensitive chip 20 is installed. The opening 31 corresponds to the photosensitive chip 20.

The filter 40 is installed on the annular protruding portion 32. In at least one embodiment, the filter 40 is installed on a surface of the annular protruding portion 32 facing away from the first rigid portion 101. The filter 40 corresponds to the photosensitive chip 20.

The base 30 further includes at least one first hole 33 passing through the first surface 301 and the second surface 303. The plurality of electronic components 21 is received in the at least one first hole 33. In at least one embodiment, each of the first holes 33 is rectangular. In this embodiment, the base 30 includes two first holes 33. The plurality of electronic components 21 may be received in one of the first holes 33. In another embodiment, each of the first holes 33 may be any other shape, such as circular or prismatic, and the number of the first hole 33 may vary according to the number of the electronic components 21.

The lens module 100 further includes a filling layer 34 in each of the first holes 33. The filling layer 34 is located on a side of the electronic components 21 facing away from the first rigid portion 101. A surface of the filling layer 34 may be flush with the first surface 301 of the base 30 facing away from the first rigid portion 101. The filling layer 34 is an insulating layer. In at least one embodiment, the filling layer 34 may be made of insulating adhesive or other organic insulating materials. In at least one embodiment, the filling layer 34 is made of silicone adhesive. The electronic components 21 corresponds to the first hole 33, and the filling layer 34 is disposed on the side of the electronic components 21 facing away from the first rigid portion 101. So that a safety distance reserved between the base 30 and the electronic components 21 may be omitted, and a limitation on a thickness of the base 30 may be avoided, thereby reducing a height of the lens module 100.

The lens holder 60 is mounted on a side of the base 30 facing away from the circuit board 10, may be through an adhesive layer 50. In at least one embodiment, the lens holder 60 may be a rectangular structure. A second hole 61 passing through the lens holder 60 is defined. The second hole 61 corresponds to the opening 31. The lens holder 60 may be made of metal or plastic. In at least one embodiment, the lens holder 60 is made of aluminum alloy.

The lens 70 is installed in the second hole 61 of the lens holder 60. In at least one embodiment, a first thread (not shown) may be formed on an inner surface of the second hole 61, and a second thread (not shown) may be formed on an outer surface of the lens 70. The first thread cooperates with the second thread to fix the lens 70 on the lens holder 60.

Figure 5:
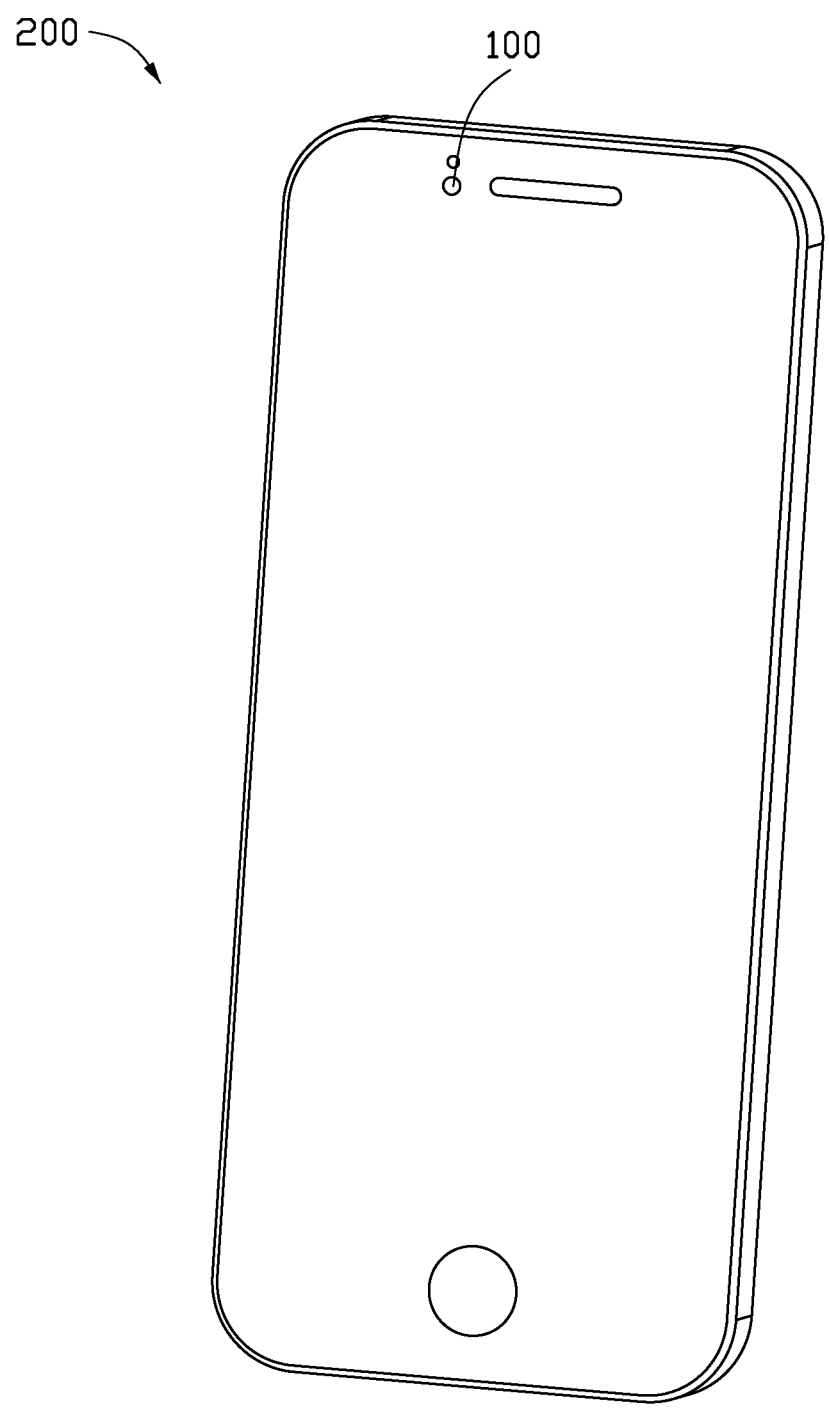
FIG. 5 is a diagram of an embodiment of an electronic device having the lens module of FIG. 1.

Referring to FIG. 5, the lens module 100 can be applied in the electronic device 200. The electronic device 200 can be a mobile phone, a laptop, a wearable device, a camera, a monitoring device, or others.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A lens module comprising:
a circuit board;
a base mounted on the circuit board; and
at least one electronic component mounted on the circuit board;
wherein the base comprises a first surface and a second surface facing away from the first surface, the second surface is mounted on the circuit board, the base further comprises at least one first hole passing through the first surface and the second surface, the at least one electronic component is received in the at least one first hole, the lens module further comprises a filling layer in each of the at least one first hole and located on a side of the at least one electronic component facing away from the circuit board, and the filling layer is an insulating layer.

2. The lens module of claim 1, wherein the filling layer is made of silicone adhesive.

3. The lens module of claim 1, wherein a surface of the filling layer is flush with the first surface of the base.

4. The lens module of claim 1, wherein the base further comprises an opening passing through the first surface and the second surface, an annular protruding portion extends from an inner surface of the opening toward a center of the opening.

5. The lens module of claim 4, wherein the lens module further comprises a filter, the filter is fixed to a surface of the annular protruding portion facing away from the circuit board.

6. The lens module of claim 4, wherein the lens module further comprises a lens holder and a lens, the lens holder is mounted on the first surface, a second hole passes through the lens holder and corresponds to the opening.

7. The lens module of claim 1, wherein the lens module further comprises a photosensitive chip, the photosensitive chip is fixed on the circuit board, the photosensitive chip and the base are mounted on a same surface of the circuit board.

8. The lens module of claim 1, wherein the circuit board comprises a first rigid portion, a second rigid portion, and a flexible portion connecting each of the first rigid portion and the second rigid portion, the base and the at least one electronic component are mounted on the first rigid portion, at least one electronic connecting element is mounted on the second rigid portion.

9. An electronic device comprising:
a lens module comprising:
a circuit board;
a base mounted on the circuit board; and
at least one electronic component mounted on the circuit board;
wherein the base comprises a first surface and a second surface facing away from the first surface, the second surface is mounted on the circuit board, the base further comprises at least one first hole passing through the first surface and the second surface, the at least one electronic component is received in the at least one first hole, the lens module further comprises a filling layer in each of the at least one first hole and located on a side of the at least one electronic component facing away from the circuit board, and the filling layer is an insulating layer.

10. The electronic device of claim 9, wherein the filling layer is made of silicone adhesive.

11. The electronic device of claim 9, wherein a surface of the filling layer is flush with the first surface of the base.

12. The electronic device of claim 9, wherein the base further comprises an opening passing through the first surface and the second surface, an annular protruding portion extends from an inner surface of the opening toward a center of the opening.

13. The electronic device of claim 12, wherein the lens module further comprises a filter, the filter is fixed to a surface of the annular protruding portion facing away from the circuit board.

14. The electronic device of claim 12, wherein the lens module further comprises a lens holder and a lens, the lens holder is mounted on the first surface, a second hole passes through the lens holder and corresponds to the opening.

15. The electronic device of claim 9, wherein the lens module further comprises a photosensitive chip, the photosensitive chip is fixed on the circuit board, the photosensitive chip and the base are mounted on a same surface of the circuit board.

16. The electronic device of claim 9, wherein the circuit board comprises a first rigid portion, a second rigid portion, and a flexible portion connecting each of the first rigid portion and the second rigid portion, the base and the at least one electronic component are mounted on the first rigid portion, at least one electronic connecting element is mounted on the second rigid portion.

* * * * *